(12) United States Patent
Patterson et al.

(10) Patent No.: US 7,474,107 B2
(45) Date of Patent: Jan. 6, 2009

(54) BURIED SHORT LOCATION DETERMINATION USING VOLTAGE CONTRAST INSPECTION

(75) Inventors: Oliver D. Patterson, Poughkeepsie, NY (US); Horatio S. Wildman, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 11/308,407

(22) Filed: Mar. 22, 2006

(65) Prior Publication Data

US 2007/0222470 A1 Sep. 27, 2007

(51) Int. Cl.
*G01R 31/305* (2006.01)
*G01R 31/28* (2006.01)

(52) U.S. Cl. ..................... 324/751; 324/765
(58) Field of Classification Search ............... 324/751, 324/500, 511, 765; 250/310, 311
See application file for complete search history.

(56) References Cited

U.S. PATENT DOCUMENTS

| 5,083,045 | A  | * | 1/1992 | Yim et al. .................. 327/51 |
| 5,959,459 | A  |   | 9/1999 | Satya et al. |
| 6,720,779 | B1 | * | 4/2004 | Lee ............................ 324/751 |
| 6,771,077 | B2 | * | 8/2004 | Hamamura et al. ......... 324/537 |
| 6,855,568 | B2 |   | 2/2005 | Weiner et al. |
| 6,861,666 | B1 |   | 3/2005 | Weiner et al. |
| 2003/0071262 | A1 | | 4/2003 | Weiner et al. |

OTHER PUBLICATIONS

Patterson et al., "Rapid Reduction of Gate-Level Electrical Defectivity using Voltage Contrast Test Structures," Proceedings of ASMC, pp. 266-272, Mar. 2003.
Wang et al., "The Study and Methodology of Defects Isolation for Contacts of Non-isolated Active Regions on New Logic Designs," ASM International, pp. 479-483, San Jose, California, Nov. 2005.
Baltzinger et al., "E-beam inspection of dislocations: product monitoring and process change validation," Proceedings of ASMC, pp. 359-366, 2004.
Weiner et al., "Defect Management for 300 mm and 130nm Technologies, Part 3: Another Day, Another Yield Learning Cycle," Yield Management Solutions, pp. 15-28, 2002.

* cited by examiner

*Primary Examiner*—Ernest F Karlsen
(74) *Attorney, Agent, or Firm*—Lisa Jaklitsch; Hoffman Warnick LLC (57) ABSTRACT

Structure and methods of determining the complete location of a buried short using voltage contrast inspection are disclosed. In one embodiment, a method includes providing a test structure having a PN junction thereunder; and using the PN junction to determine the location of the buried short using voltage contrast (VC) inspection. A test structure may include a plurality of test elements each having a PN junction thereunder, wherein a location of the buried short within the test structure can be determined using the PN junction and the VC inspection. The PN junction forces a change in illumination brightness of a test element including the buried short, thus allowing determination of the complete location of a buried short.

5 Claims, 10 Drawing Sheets

BURIED SHORT LOCATION DETERMINATION USING VOLTAGE CONTRAST INSPECTION

BACKGROUND OF THE INVENTION

1. Technical Field

The invention relates generally to semiconductor fabrication, and more particularly, to test structures and a method of determining the complete location of a buried short using voltage contrast inspection.

2. Background Art

In-line voltage contrast (VC) inspection is a powerful technique for detecting and isolating yield limiting defects in the semiconductor fabricating industry. In-line VC inspection includes scanning the wafer surface in which test structures exist with a scanning electron microscope (SEM). As the inspection proceeds, the SEM induces charge on all electrically floating elements whereas any grounded elements remain at zero potential. This potential difference is visible to the SEM. In particular, for electron landing energies less than the second crossover of the secondary electron yield curve (approximately 1.5 keV for tungsten (W) and copper (Cu)), grounded elements appear bright whereas floating elements appear dark.

Figure 1A:
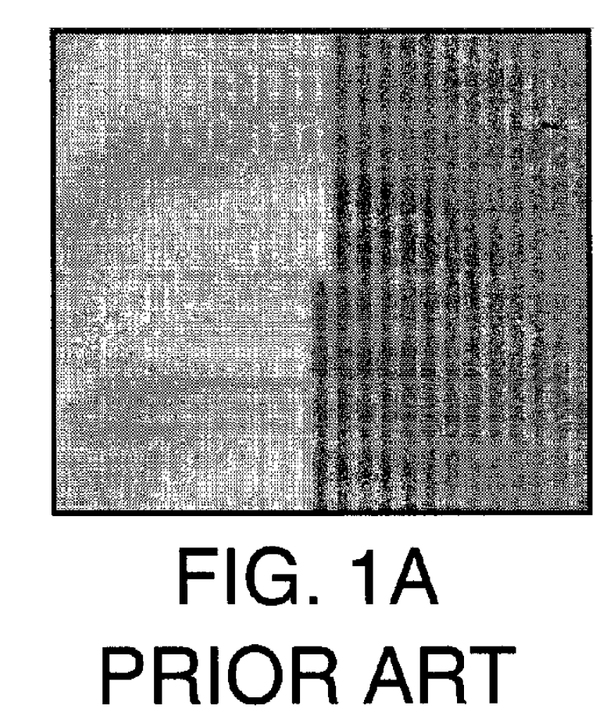
FIGS. 1A-B show images of defects observed using conventional voltage contrast (VC) inspection.
Figure 1B:
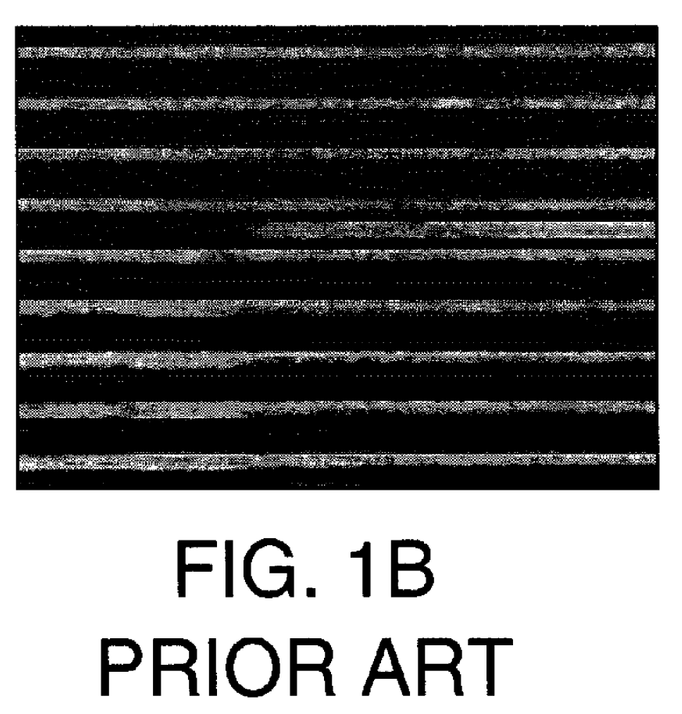

Test structures exploiting this phenomenon can be created for many yield limiting defects including metal, gate and active region shorts and opens, and via and contact opens. For example, FIGS. 1A-B, show a short (FIG. 1B) indicated by a normally floating (dark) element becoming bright, and an open (FIG. 1A) indicated when a normally bright element becomes dark.

Figure 2:
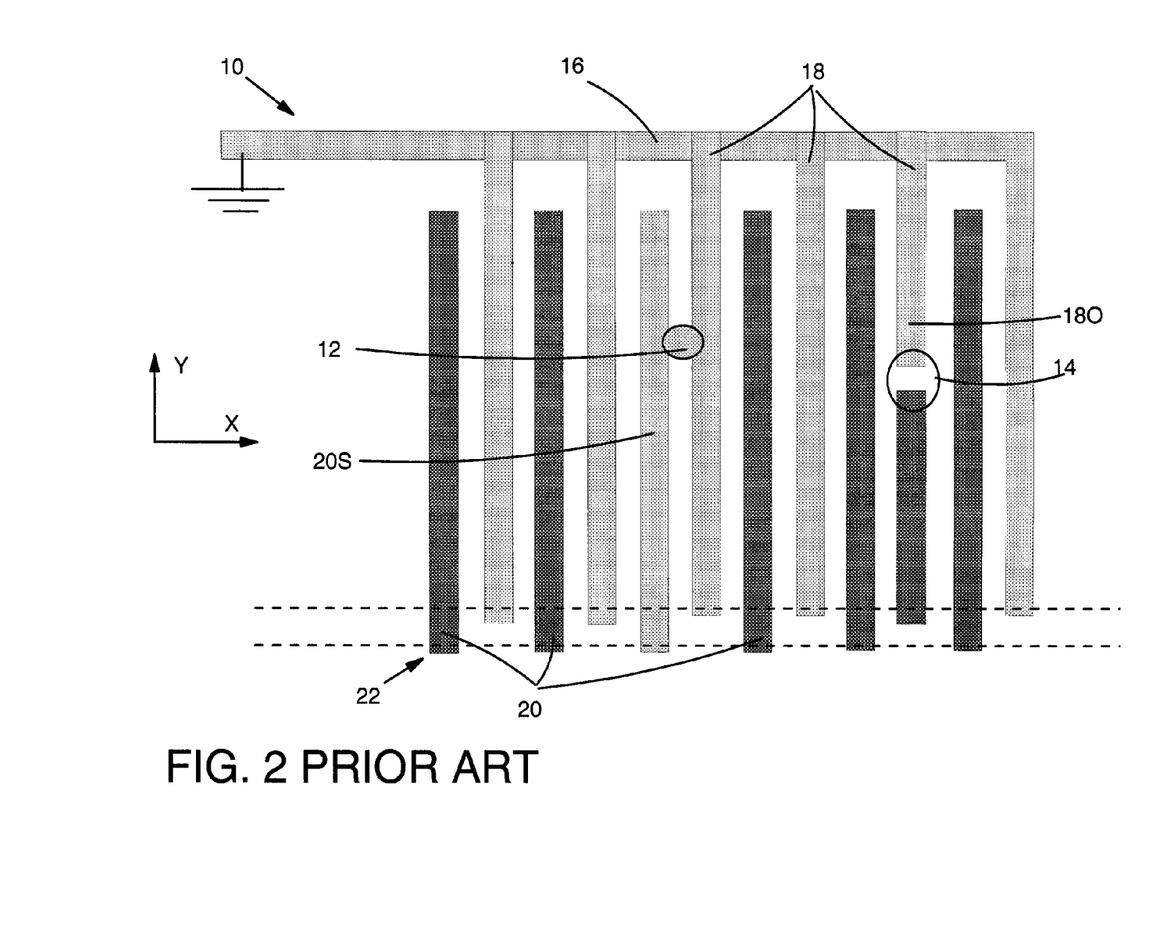
FIG. 2 shows how an illustrative test structure changes illumination brightness under VC inspection when a short or open exists according to the prior art.

One advantage of this technique is that even if the defect causing the electrical failure is buried or extremely small, its existence is flagged by a change in the VC inspection signal of the entire element. Referring to FIG. 2, as a result of this situation it is possible to scan (between dashed lines) just the bottom of a test structure 10 and still detect the existence of an electrically active defect 12, 14 anywhere on that structure. See, for example, Weiner, K., Henry T., Satya, A., Verman, G., Wu, R., Patterson, O., Crevasse, B., Cauffman, K., Cauffman, W., Defect Management for 300 mm and 130 mm Technologies Part 3: Another Day, Another Yield Learning Cycle, Yield Management Solutions magazine, Vol. 4, Iss. 1, pp. 15-27, Winter 2002. This technique is referred to as "area acceleration" because only a small portion of an area (between dashed lines) must be scanned during VC inspection in order to identify a defect. FIG. 2 shows how the VC inspection pattern changes when a short 12 or open 14 exists. Test structure 10 includes a grounded comb 16 including grounded tines 18 which are interleaved with ungrounded tines 20 of a second backless comb 22. Ungrounded tines 22 are isolated from each other and grounded comb 16. If an open 14 exists on a grounded tine 180 of grounded comb 16, the VC signal changes on that tine 180, e.g., it is darker in parts than other grounded tines 18 on the open portion. If a short 12 exists between a grounded tine 18 and a floating, ungrounded tine 20S of backless comb 22, the VC signal of the floating tine changes, e.g., the shorted ungrounded tine 20S illuminates brighter than other ungrounded tines 20.

KLA-Tencor markets a product called uLoop™ that is based on the above-described principal. Using this technology, once a defect is detected using a scan as shown in FIG. 2 (between dashed lines) in a first (x) direction, the x coordinate of the defect is established. Next, the structure can be scanned in a second (y) direction for the location of the buried short to be determined. The uLoop™ software does this automatically. It also can be done manually fairly easily, although not nearly as quickly, using an inspection SEM, a review or critical dimension (CD) SEM or a focused ion beam (FIB) tool. In any case, only a small fraction of the test structure needs to be scanned. Applying area acceleration typically results in a time savings of 70-90%.

Unfortunately, in some cases a defect is not visible. For example, oftentimes contact or via opens, buried metal shorts, gate oxide shorts or silicide pipes are not visible. Such defects are often referred to as buried shorts. The location of buried opens, and in particular their y coordinate, on area accelerated test structures can be determined because the VC signal will change at the location of the defect as shown in FIG. 2 for tine 180, and as shown in the images of FIGS. 1A and 1C. The location cannot, however, be established for buried shorts because the illumination brightness of the tine containing the short will be the same regardless of the short's location. For example, shorted tine 20S in FIG. 2 illuminates the same along it's entire length. FIG. 1B also shows this situation.

Figure 3:
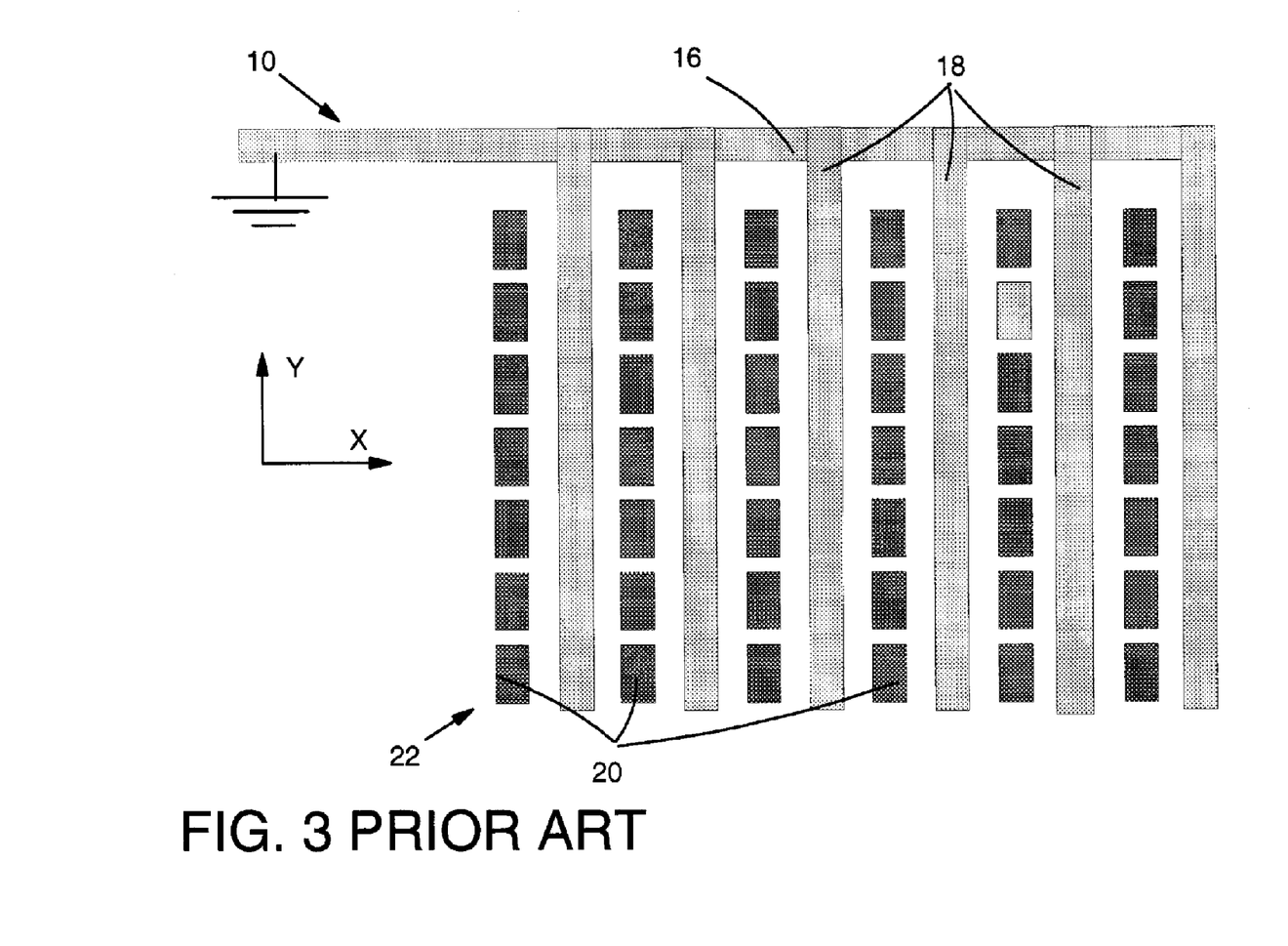
FIG. 3 shows one approach of determining the location of a buried short according to the prior art.
Figure 4:
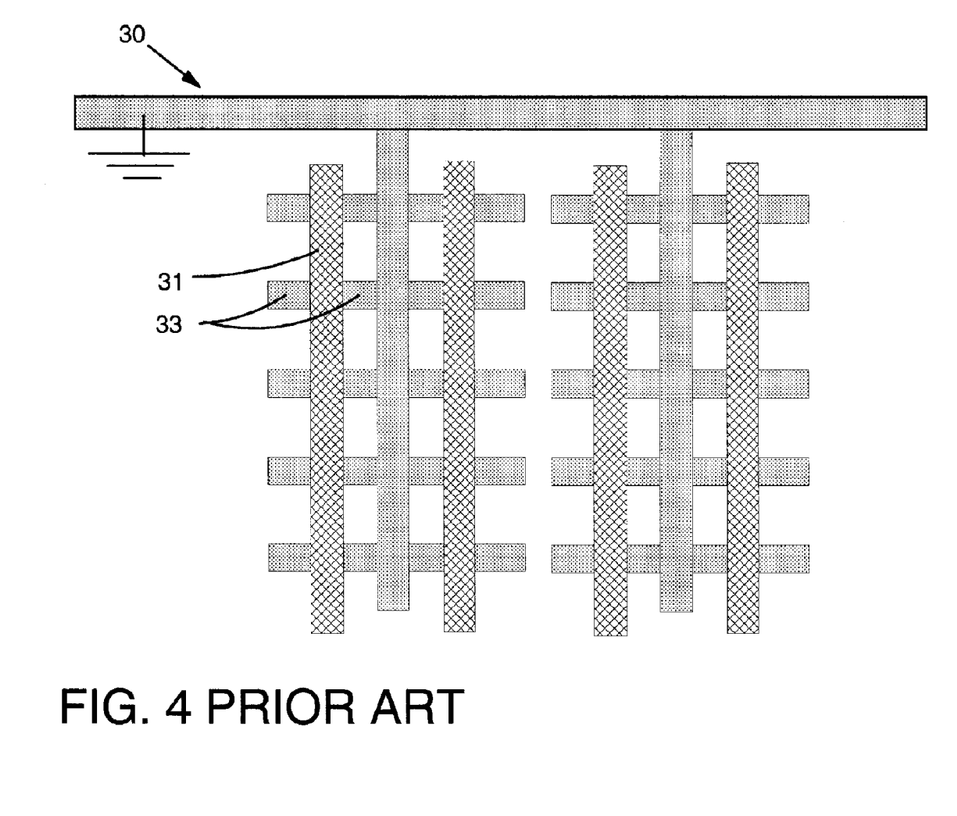
FIG. 4 shows another test structure that could be used to detect silicide pipes according to the prior art.

One approach for isolating a buried short using VC inspection is to divide the test structure design into small pieces for analysis. FIG. 3 shows how test structure 10 in FIG. 2 may be modified so that a buried short could be isolated. FIG. 4 shows such a test structure 30 that could be used to detect silicide pipes, with polysilicon conductor regions 31 and source and drain regions 33. Unfortunately, area accelerated VC inspection cannot be applied to these structures. That is, the entire structure must be VC inspected. In another approach, an area accelerated test structure is used like test structure 10 in FIG. 2, and the defect is located using an in-line FIB tool. This approach requires that the defective tine be cut in half. The half with the VC signal would then be split again and so forth. A buried short on a 1 mm long tine could be isolated to a 1 µm segment using 10 cuts. Unfortunately, this approach is expensive and time consuming and results in wafer scrap.

In view of the foregoing, there is a need in the art for a solution to the problems of the related art.

SUMMARY OF THE INVENTION

Structure and methods of determining the complete location of a buried short using voltage contrast inspection are disclosed. In one embodiment, a method includes providing a test structure having a PN junction thereunder; and using the PN junction to determine the location of the buried short using voltage contrast (VC) inspection. A test structure may include a plurality of test elements each having a PN junction thereunder, wherein a location of the buried short within the test structure can be determined using the PN junction and the VC inspection. The PN junction forces a change in illumination brightness of a test element including the buried short, thus allowing determination of the complete location of a buried short.

A first aspect of the invention provides a test structure for determining a location of a buried short using voltage contrast (VC) inspection, the test structure comprising: a plurality of test elements each having a structure allowing current flow in only one direction and only when forward biased, wherein a location of the buried short within the test structure can be determined using the structure and the VC inspection.

A second aspect of the invention provides a method of determining a location of a buried short, the method comprising the steps of: providing a test structure having a structure allowing current flow in only one direction and only when forward biased; and using the structure to determine the location of the buried short using voltage contrast (VC) inspection.

A third aspect of the invention provides a method of determining a location of a buried short, the method comprising the steps of: providing a plurality of test elements having a PN junction under a portion thereof, the plurality of test elements having a shared sense line; performing a VC inspection of a portion of the shared sense line in a first direction, wherein the shared sense line illuminating brighter than at least a portion of one test element indicates a presence of the buried short; determining a first coordinate of the location of the buried short based on the location of the shared sense line; and determining a second coordinate of the location of the buried short by identifying a brighter test element illuminating brighter than at least a portion of another of the plurality of test elements.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 5A:
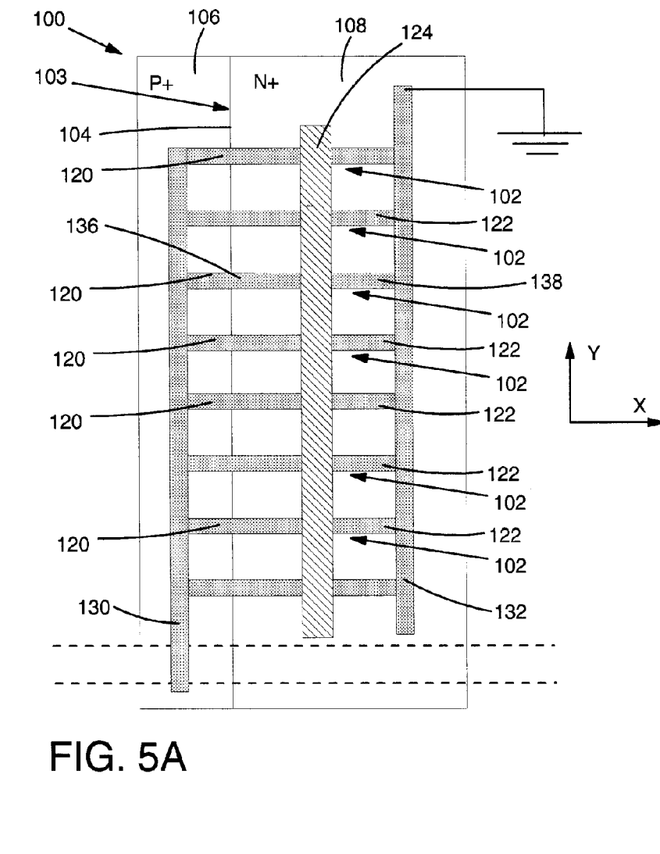
FIGS. 5A-C show various embodiments of a test structure according to the invention.
Figure 5B:
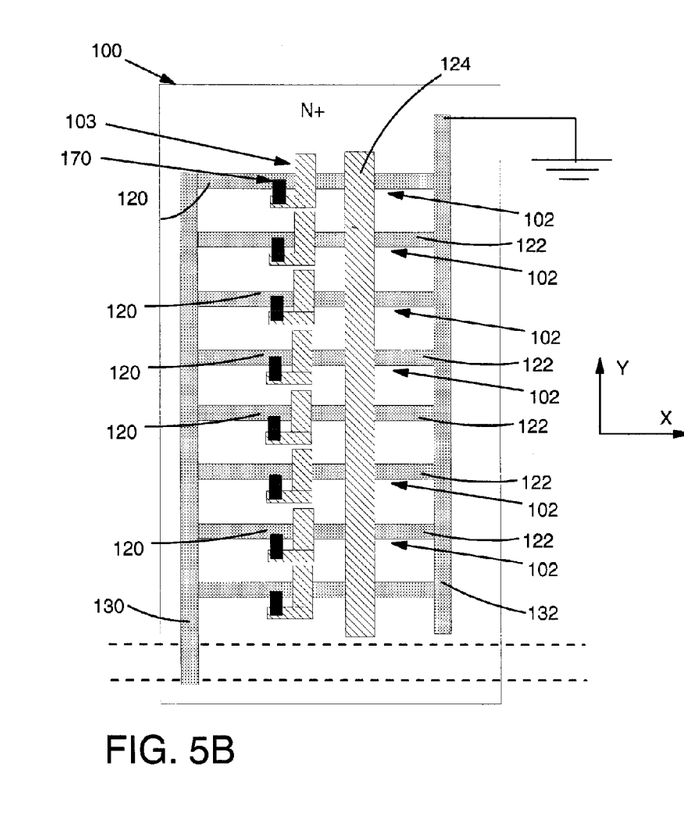
Figure 5C:
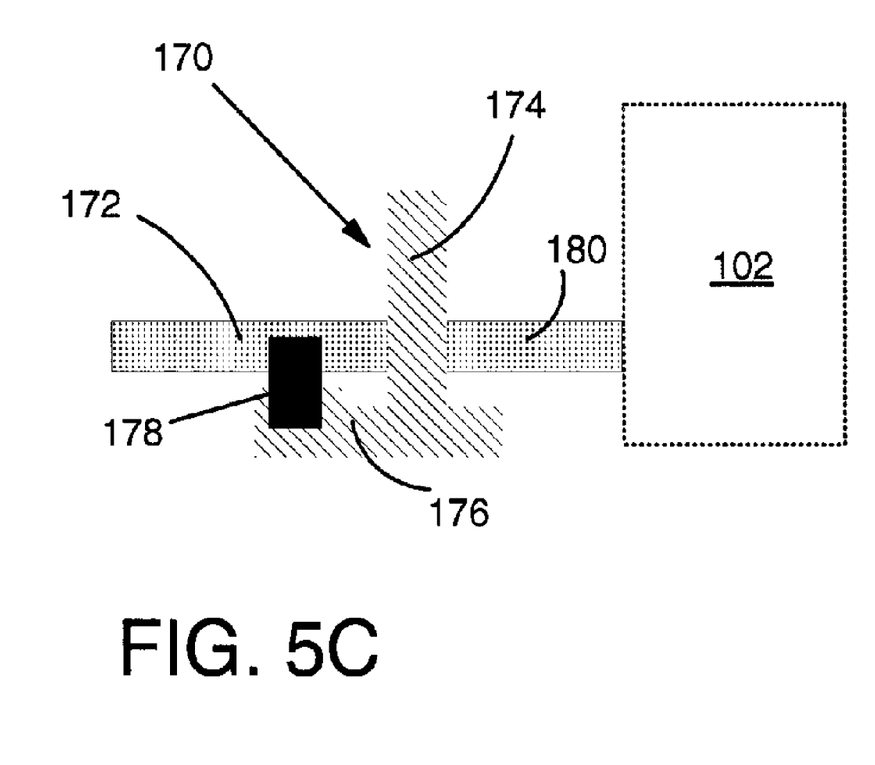

Turning to the drawings, FIGS. 5A-C show various embodiments of a test structure 100 for determining a location of a buried short using voltage contrast (VC) inspection according to the invention. "Buried short" as used herein includes any manner of short that is not visible through non-invasive, simple physical inspection. As such, a buried short may not be literally buried, but may be smaller than is visible through non-invasive, simple physical inspection. A buried short 140 (FIG. 7) may include, for example, a short such as a silicide pipe, a gate oxide (e.g., silicon dioxide) short, a buried metal short, a buried substrate to active region short, or any other type of short. Test structure 100 may include a plurality of test elements 102 each having a structure 103 allowing current flow in only one direction and only when forward biased. A location of a buried short 140 (FIG. 7) within test structure 100 can be determined using structure 103 using VC inspection, as will be described below relative to a number of illustrative applications. It is understood that a test structure according to the invention may be implemented in different applications than that illustrated and described herein.

Figure 7:
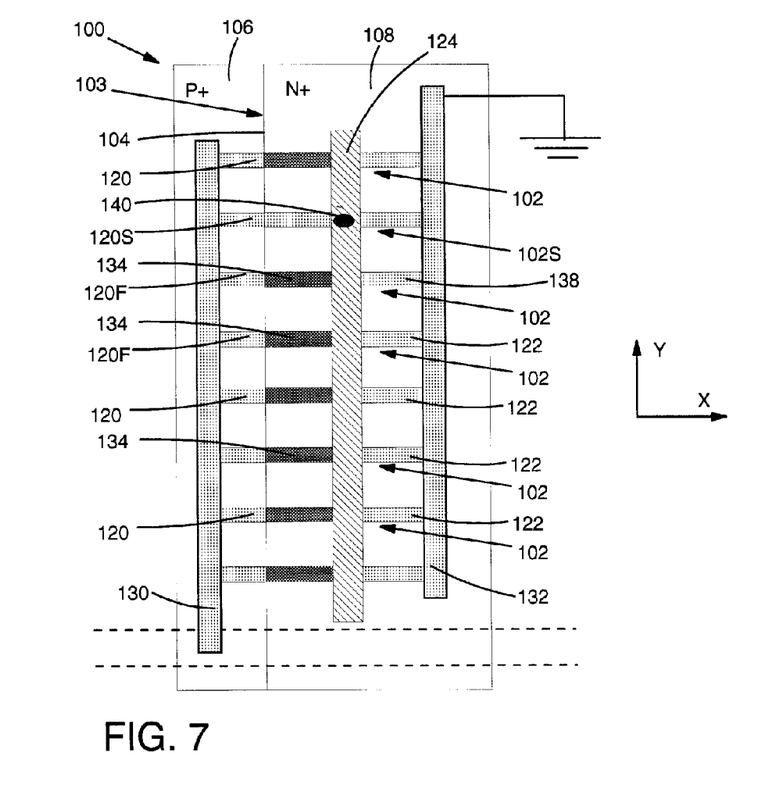
FIG. 7 shows the test structure FIG. 5A under VC inspection and having a buried short.

FIGS. 5A-B show one illustrative application of test structure 100 for determining the location of a source-to-drain short 140 (FIG. 7). In this illustrative application, test structure 100 may include a plurality of test elements 102 each in the form of a transistor including a first active region 120, a second active region 122 and a gate electrode 124. In one embodiment, shown in FIG. 5A, structure 103 includes a PN junction 104 under each test element 102. PN junction 104 may be formed at an interface between, for example, a P+ doped region 106 and an N+ doped region 108. (A polyconductor member, not shown, may be provided over PN junction 104, but is not necessary). In this case, PN junction 104 is under first active regions 120, which are connected by a shared sense line 130. In addition, second active regions 124 are grounded by a shared ground line 132. In one embodiment, first active region 120 provides a source region 136 and second active region 122 forms a drain region 138 for each test element 102, i.e., transistor. However, the source and drain regions 136, 138 may be switched.

In an alternative embodiment, shown in FIGS. 5B-C, structure 103 may include a specially structured n-type field effect transistor (NFET) 170. As best observed in FIG. 5C, NFET 170 includes a source region 172 and a gate electrode 174 shorted together via a gate contact 176 and a local interconnect 178. The short is positioned on a side of test element 102 closest to a sense line 130, and source region 172 is connected to sense line 130. One advantage of using an NFET 170 compared to PN junction 104 (FIG. 5A) is that the voltage drop across NFET 170 would be lower than that for PN junction 104, e.g., approximately 0.15 V rather than approximately 0.6 V. By connecting gate electrode 174 to source region 172, current flow is enabled from source region 172 to a drain region 180 of NFET 170 when source region 172 is approximately 0.15 V greater than drain region 180. Current cannot flow in the opposite direction under any circumstance. Note that with the FIGS. 5B-C embodiment, test structure 100 could only be inspected after the local interconnect level is complete.

In one embodiment, as shown in FIGS. 5A-B, test elements 102 are spaced evenly so as to evenly segment test structure 100. However, even spacing is not necessary. In operation, a VC inspection is performed using, for example, a scanning electron microscope (SEM). The VC inspection scans only a portion of shared sense line 130 in a first direction (x-direction), as indicated by dashed lines in FIGS. 5A-B. As described herein, the VC inspection implements an electron extraction technique in which positive charge is accumulated. It is understood, however, that the teachings of the invention may be easily switched to accommodate a retarding technique in which negative charge is accumulated.

Figure 6:
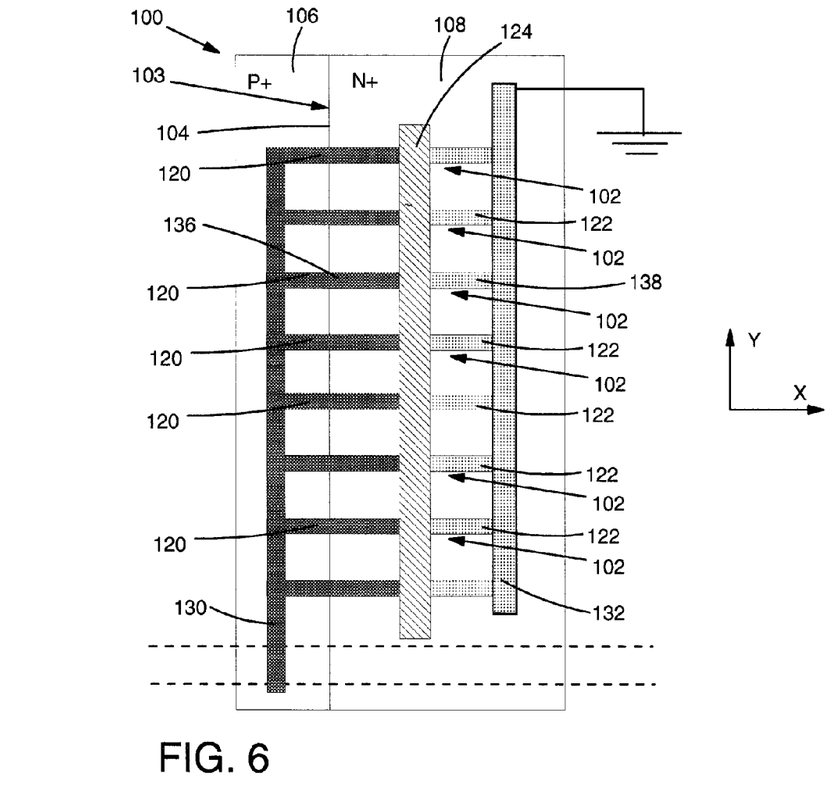
FIG. 6 shows the test structure of FIG. 5A under VC inspection and without a buried short.

Turning to FIG. 6, operation of test structure 100 will be further described relative to the embodiment of FIG. 5A. It should be recognized, however, that similar operation is attainable using the embodiment of FIGS. 5B-C. Referring to FIG. 6, where no buried short exists in test structure 100, structure 103 causes all of first active regions 120 and shared sense line 130 to illuminate dark, indicating first active regions 120 are all floating and no buried short exists. However, second active regions 122 are grounded by shared ground line 132 and thus illuminate brighter than first active regions 120 because they do not accumulate positive charge in an electron extraction technique VC inspection. In contrast, FIG. 7 shows test structure 100 during VC inspection where a buried short 140 exists in test structure 100. In this case, shared sense line 130 and all of a brighter first active region 120S having buried short 140 illuminate brighter than a dark portion 134 of another first active region 120F not having buried short 140 during VC inspection. More specifically, PN junction 104 provides a diode for each first active region 120, allowing current to flow in only one direction. Similarly, NFET 170 (FIGS. 5B-C) would provide a current stop for each first active region 130, allowing current flow in only one direction. As a result, if buried short 140 exists through one of transistors 102S, then all of brighter first active region 120S of that transistor 102S and shared sense line 130 become grounded. Second active regions 122 are also grounded. However, dark portions 134 of first active regions 120 that do not include buried short 140 (on a gate-side of PN junction 104) build up positive charge during VC inspection because PN junction 104 becomes forward biased. As a result, the current flow from dark portions 134 of first active regions 120 on a gate-side of structure 103 is prevented by structure 103, i.e., PN junction 104 or NFET 170 (FIGS. 5B-C). As these structures build up charge, they become reverse biased and the structures illuminate darker than the grounded structures, e.g., shared sense line 130 and brighter first active region 120S. As a result, brighter first active region 102S stands out. In contrast, those first active regions 120 not having buried short 140 only illuminate brighter than second active regions 122. In this fashion, shared sense line 130 indicates a first coordinate of the location of buried short 140, e.g., along an x-direction, and the location of completely brighter first active region 120S indicates a second coordinate, i.e., along a y-direction, of the location of buried short 140. Hence, the complete location of buried short 140 can be easily determined.

Figure 8:
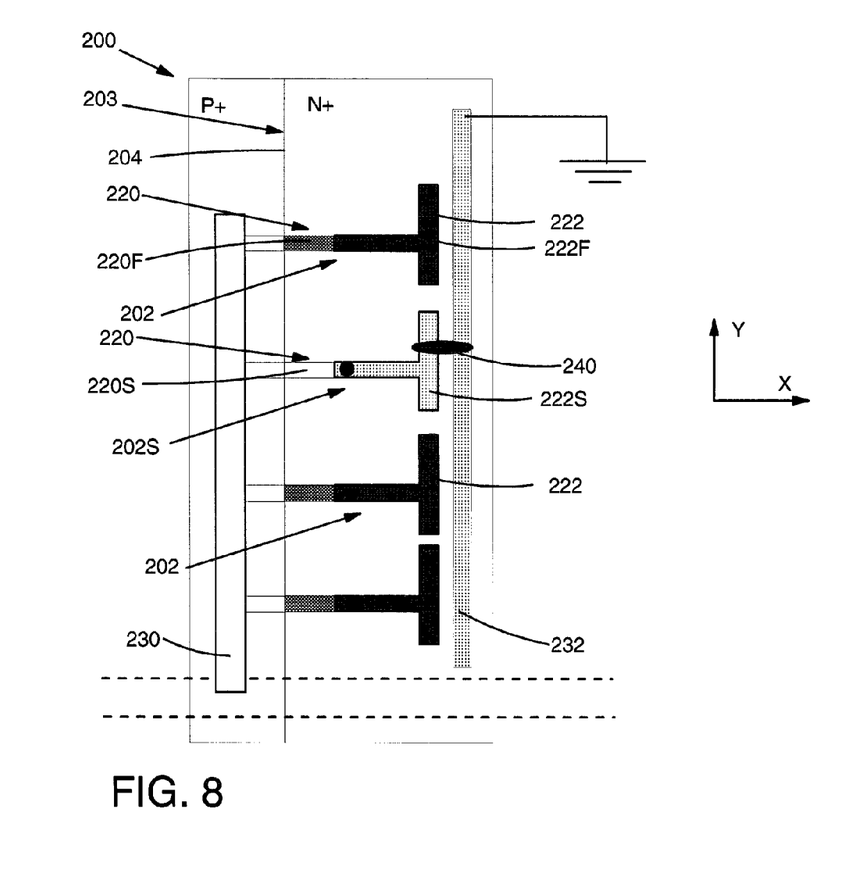
FIG. 8 shows another embodiment of a test structure according to the invention.

Turning to FIG. 8, another illustrative application of a test structure 200 for determining the location of a metal short 240 is shown. In this embodiment, plurality of test elements 202 each include an active region 220 coupled to a metal portion 222 positioned adjacent to a ground line 232. Active regions 220 are connected by a shared sense line 230, and a structure 203 is provided. In this case, test structure 300 includes a PN junction 204 extending under active regions 220. It should be recognized, however, that similar operation is attainable using the embodiment of FIGS. 5B-C. As shown in FIG. 8, in operation during a VC inspection, shared sense line 230 and a portion of a brighter active region 220S having buried short 240 illuminate brighter than a portion of a darker active region 220F not having buried short 240 during VC inspection. In this case, shared sense line 230 indicates a first coordinate (e.g., x-coordinate) of the location of buried short 240 and the location of brighter active region 220S indicates a second coordinate (e.g., y-coordinate) of the location of buried short 240. In addition, metal portion 222S that includes buried short 240 also illuminates brighter than other metal portions 222F, which are floating. Accordingly, metal portion 222S may also be used to determine the second coordinate. In comparing which parts are brighter, it may be necessary to compare metal-to-metal and active region to active region.

In an alternative embodiment, the invention may provide a method of determining a location of a buried short 140, 240. In this embodiment, a first step includes providing a test structure 100, 200 having a structure 103, 203 allowing current flow in only one direction and only when forward biased, and using structure 103, 203 to determine the location of buried short using VC inspection. Test structures 100, 200 can be provided as described above. For test structure 100 (FIGS. 5A-7), the using step may include performing a VC inspection of a portion of shared sense line 130 such that when it illuminates brighter than a dark portion 134 of first active region 120 indicates a presence of buried short 140, i.e., the expected brightness is known such that if it is brighter, it can be detected. Next, the using step may include determining a first coordinate of the location of buried short 140 based on the location of shared sense line 130, and then determining a second coordinate of the location of buried short 140 by identifying a brighter first active region 120S that illuminates brighter than dark portion 134. For test structure 200 (FIG. 8), the using step may include performing the VC inspection of a portion of shared sense line 230 such that when it illuminates brighter than a darker active region 220F it indicates a presence of buried short 240. Here, the using step may further include determining a first coordinate of the location of buried short 240 based the location of shared sense line 230, and determining a second coordinate of the location of buried short 240 by identifying a location of a brighter active region 220S that illuminates brighter than darker active region 220F. Also, brighter metal portion 222S may be used to determine the second coordinate.

In another alternative embodiment, a method of determining a location of a buried short 140, 240 may be provided including: providing a plurality of test elements 102, 202 having a structure 103, 203 allowing current flow in only one direction and only when forward biased, the plurality of test elements 102, 202 having a shared sense line 130, 230. Next, a VC inspection is performed of a portion of shared sense line 130, 230 in a first direction such that when shared sense line 130, 230 illuminates brighter than at least a portion of one test element 102, 202, it indicates a presence of buried short 140, 240. Based on this knowledge, a first coordinate of the location of buried short 140, 240 can be determined based on the location of shared sense line 130, 230, and a second coordinate of the location of buried short 140, 240 can be determined by identifying brighter test element 102S, 202S illuminating brighter than at least a portion of another of the plurality of test elements 102, 202.

It is emphasized that even though two illustrative applications have been described herein that the teachings of the invention are applicable to a wide variety of buried short detection applications.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A test structure for determining a location of a buried short using voltage contrast (VC) inspection, the test structure comprising:

a plurality of test elements each having a structure allowing current flow in only one direction and only when forward biased, wherein the plurality of test elements each include a transistor including a first active region, a second active region and a gate electrode, wherein the structure includes one of a PN junction under each test element and an n-type field effect transistor having a source region and a gate electrode shorted together, and wherein in the case that the structure includes a PN junction, the PN junction is under the first active regions, which are connected by a shared sense line, and the second active regions are grounded by a shared ground line, and wherein a location of the buried short within the test structure can be determined using the structure and the VC inspection.

2. The test structure of claim 1, wherein the VC inspection is performed using a scanning electron microscope (SEM).

3. The test structure of claim 1, wherein the shared sense line and all of a brighter first active region having the buried short illuminates brighter than a dark portion of another first active region not having the buried short during VC inspection, wherein the shared sense line indicates a first coordinate of the location of the buried short and the location of the brighter first active region indicates a second coordinate of the location of the buried short.

4. The test structure of claim 1, wherein the plurality of test elements each include an active region coupled to a metal portion positioned adjacent to a ground line, wherein the active regions are connected by a shared sense line and the PN junction extends under the active regions.

5. The test structure of claim 4, wherein the shared sense line and a portion of a brighter active region having the buried short illuminate brighter than a portion of a darker active region not having the buried short during VC inspection, wherein the shared sense line indicates a first coordinate of the location of the buried short and the location of the brighter active region indicates a second coordinate of the location of the buried short.

* * * * *